United States Patent [19]

Austin

[11] Patent Number: 5,491,436
[45] Date of Patent: Feb. 13, 1996

[54] COMPENSATED CMOS DRIVER CIRCUIT WITH REDUCED DC LOSSES

[75] Inventor: John S. Austin, Essex Junction, Vt.

[73] Assignee: International Business Machines Corp., Armonk, N.Y.

[21] Appl. No.: 282,835

[22] Filed: Jul. 29, 1994

[51] Int. Cl.$^6$ .................................................. H03K 17/14
[52] U.S. Cl. .......................... 327/108; 327/379; 327/111; 326/82; 326/83
[58] Field of Search ..................................... 327/108, 111, 327/112, 378, 538, 543, 541, 77–80, 362, 379, 362; 326/82, 83, 84, 85, 87, 89, 91

[56] References Cited

U.S. PATENT DOCUMENTS

| | | | |
|---|---|---|---|
| 4,614,882 | 9/1986 | Parker et al. | 307/443 |
| 4,818,901 | 4/1989 | Young et al. | 307/451 |
| 4,975,595 | 12/1990 | Petrovick, Jr. et al. | 307/443 |
| 4,975,598 | 12/1990 | Borkar | 307/443 |
| 5,177,376 | 1/1993 | Wellnitz et al. | 307/290 |
| 5,293,082 | 3/1994 | Bathaee | 327/108 |
| 5,329,190 | 7/1994 | Igarashi et al. | 307/540 |

FOREIGN PATENT DOCUMENTS 5206830  8/1993  Japan ........................................ 326/83

Primary Examiner—Timothy P. Callahan
Assistant Examiner—Eunja Shin
Attorney, Agent, or Firm—Thornton & Thornton; Lawrence H. Meier

[57] ABSTRACT

According to the present invention, an improved integrated circuit is provided having a first, second and third FET device and wherein at least one performance characteristic of the first and second device varies in the same manner with the variations of one performance related process variable condition such that each of the first and second devices have an output signal changed by a change in that performance related variable condition, and the first and second devices are connected with the one output characteristic of the second device acting in opposition to that of the first device to provide a merged output signal representative of offsetting effects of the first and second devices. The third device is connected within a voltage divider and coupled to the first and second FET devices to turn off both the divider and the second device responsive to the merged output signal rising to a select value.

11 Claims, 1 Drawing Sheet

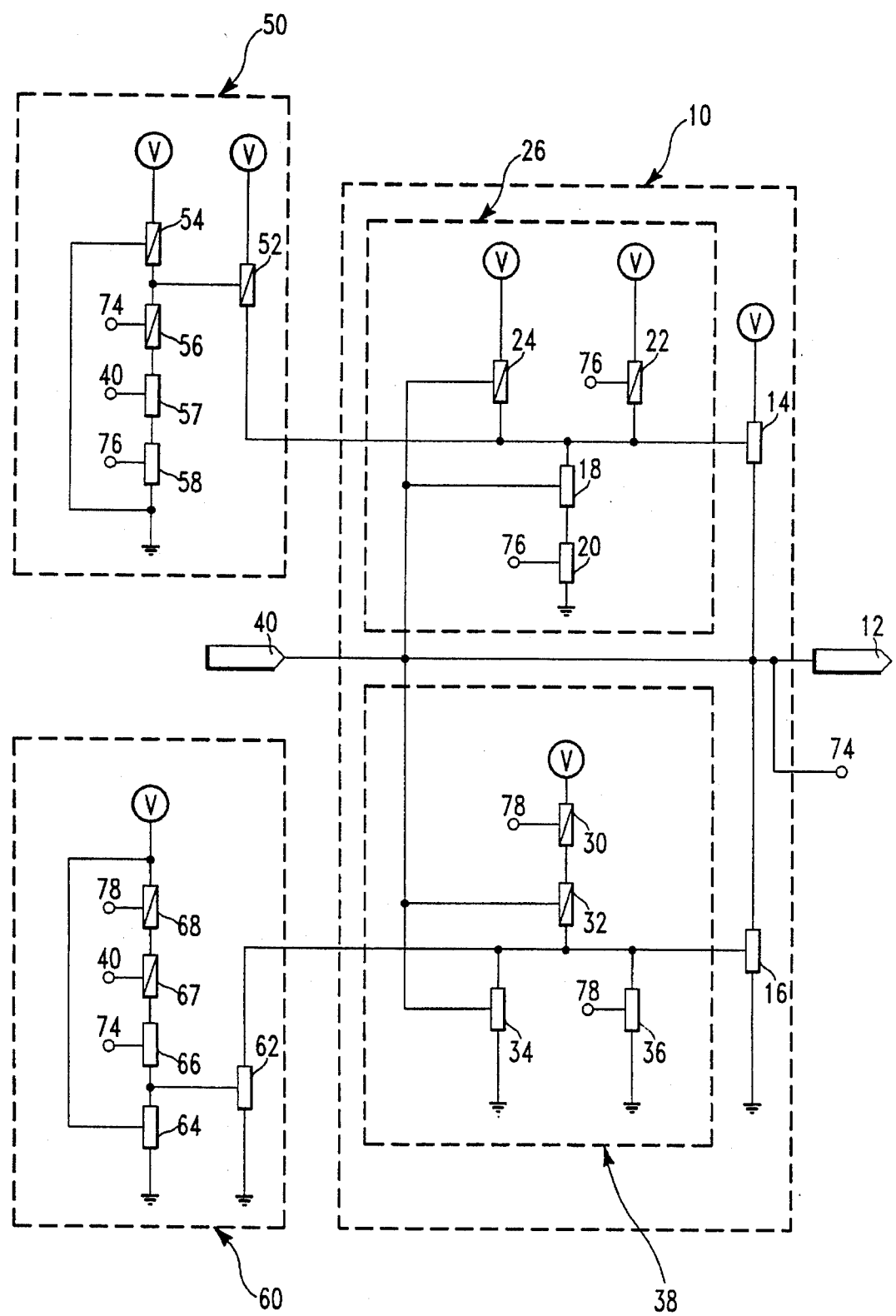

5,491,436

COMPENSATED CMOS DRIVER CIRCUIT WITH REDUCED DC LOSSES

FIELD OF THE INVENTION

This invention relates to driver circuits and more particularly to a compensated CMOS driver circuit having increased efficiency.

BACKGROUND OF THE INVENTION

In the production of CMOS integrated circuity, process variables can significantly affect the performance characteristics of many of the devices, particularly driver devices formed on the chip. These performance characteristics include delay, rise and fall time, and impedance etc. The process variables which affect these performance characteristics include variation of channel length, thickness of the dielectric in the gate electrode channel and diffusion channel width, and supply voltage etc. All of these factors can have a significant cumulative effect on the circuit operation. As is well known, when the driver circuit is designed to drive a certain load, if the driver circuit operates too fast, noise will be generated and interfere with signal recognition. On the other hand, if the circuit operates too slow, performance time is impaired. Since cost effective arrangements for eliminating these process variations are not readily available in the present state of the art, it has become necessary to provide compensation in the circuit for such variables.

Suitable compensation is provided by the circuit described in U.S. Pat. No. 4,975,599, issued on Dec. 4, 1990, wherein a CMOS circuit includes a compensating device having a performance characteristic which varies in a similar manner as that of a driver device and which is arranged in the circuit such that its output acts in compensating opposition to the output of the driver device. This arrangement suitably resolves the above noted variations in performance, however, it necessitates a given level of circuit complexity, and requires additional power which can be of critical importance in low power applications.

SUMMARY OF THE INVENTION

According to the present invention, an improved integrated circuit preferably a CMOS circuit, is provided having a first, a second and a third FET device and wherein at least one performance characteristic of said first and second device varies in the same manner with the variations of one performance related process variable condition. Each of the first and second devices has an output signal which is changed by a change in such performance related variable condition, and these devices are connected with the one output characteristic of the second device acting in opposition to that of the first to provide a merged output signal representative of the combined effect of both the first and second devices. The second device is constructed to be more responsive to the variations in such performance related condition than the first and to have a weaker output signal than the first whereby the merged output signal of the first and second device is maintained consistent, and the third FET device is coupled to the first and second FET devices and is responsive to the merged output to shut off the second device when the merged output signal rises above a select value. The third device is connected within a voltage divider which controls the operation of the second device, and the third device is responsive to the output of the circuit to turn off both the voltage divider and the second device when the merged output signal rises above a select value.

BRIEF DESCRIPTION OF THE DRAWINGS

The drawing provides a circuit diagram of a compensated CMOS circuit according to the invention.

DESCRIPTION OF THE PREFERRED EMBODIMENT

Referring to the drawing, wherein a CMOS circuit according to the present invention is shown, the circuit includes a conventional driver circuit 10 which drives off-chip devices such as capacitors indicated collectively at 12. As shown and described in the aforementioned U.S. Pat. No. 4,975,599, which is incorporated herein by reference, the driver circuit 10 is also connected to a receiver circuit (not shown) and includes a P/FET transistor 14 and an N/FET transistor 16 coupled to drive the load 12. These output transistors 14, 16 are pull-up and pull-down transistors, respectively connected in a conventional manner to drive the load 12. The transistor 14 is turned "on" by two N/FET transistors 18 and 20 which are connected in series, whereas two P/FET transistors 22 and 24 are also connected to the transistor 14 for the purpose of turning "off" the latter. The transistors 18, 20, 22 and 24 constitute a conventional NAND gate shown in dotted outline and designated in the drawing as 26.

Similarly, an N/FET transistor 16 is connected to and turned "on" by a pair of serially connected P/FET transistors 30 and 32. Additionally, the N/FET transistors 34, 36 are connected to the transistor 16 for the purpose of turning "off" the latter. As can be readily understood, the transistors 30, 32, 34 and 36 constitute a conventional NOR gate, shown in dotted outline in the drawing and designated as 38.

The data signal to operate the transistors 18, 24 and 57 as well as the transistors 32, 34 and 67 is provided from an input source 40. In a well known manner, when a signal is provided to transistors 18 and 32 to turn them "on", one or the other will be actuated respectively and will turn "on" its associated transistor 14 or 16, which in turn will supply voltage to the load 12.

As explained in detail in the aforementioned U.S. Pat. No. 4,975,599, the speed or rate at which either of the transistors 14 and 18 or 16 and 32 is turned "on" can vary widely, depending upon process variables. These process variables include the transistor channel length, their threshold voltage, the thickness of the dielectric between their gate electrode and channel, the base mobility of each, and variations in their channel width. External variables, such as the temperature, etc., can also effect the performance of the circuit.

To compensate for variations in circuit performance, a compensator circuit 50 is provided for the P channel, and includes P/FET transistors 54, and 56 and N/FET transistors 57 and 58 connected in series. Further, the compensator 50 includes a P/FET transistor 52 having its gate connected between the transistors 54 and 56 as shown, such that the transistor branch comprised of the transistors 54, 56, 57 and 58 form a voltage divider with the P/FET transistor 56 (as subsequently explained in greater detail) controlled by the driver output signal to turn "off" both the voltage divider and the compensating transistor 52.

As explained in the aforementioned patent, the output of the P/FET transistor 52 is in opposition to and merged with the output of the N/FET transistors 18 and 20 as shown, such that the path from the transistors 18 and 20 to the transistor 14 (which is a pull-up transistor) tends to turn the transistor 14 "on" when the transistors 18 and 20 are turned "on", whereas the output of the transistor 52 when it is turned "on", tends to turn the transistor 14 "off". Thus, the transistor 52 acts in opposition to the action of the transistors 18 and 20. As subsequently explained, the transistor 52 is designed to be more sensitive to the process variables but less powerful then the transistors 18 and 20 so as to merely compensate by acting in opposition to the signal from the transistors 18 and 20.

Thus, it can be seen that if the process variables utilized in forming the transistors of the inventive circuit are such that any given process variable would tend to make the transistors 18 and 20 operate faster, the same process variable would also tend to make the transistor 52 operate faster. The fast operation of the transistors 18 and 20 tend to turn the transistor 14 on harder, whereas the fast operation of the transistor 52, acting in opposition to that of the transistors 18, 20, tend to hold back or slow down the operation of the transistor 14. Conversely, if the process variables tend to make the transistors 18, 20 operate more slowly, the same process variable will also make the transistor 52 operated more slowly. Under such circumstances, while the output from the transistors 18, 20 will tend to turn "on" the transistor 14 less hard, the output of the transistor 52 (in opposition to the output of the transistors 18, 20) will tend to be substantially lower. Thus, the transistor 52 is made less powerful than the transistors 18, 20 but more sensitive to the process variables, so that it will act in an offsetting or compensating manner, and hence, the merged output will provide a turn "on" signal (to the output transistor 14) which is more consistent irrespective of process variables than would be obtainable with an uncompensated circuit.

Similarly, an N channel compensator circuit 60 is provided which has N/FET transistors 64 and 66 and P/FET transistors 67 and 68 forming a voltage divider controlling an N/FET transistor 62 connected in a manner similar to that of the compensator 50 and acting in a similar manner in conjunction with the transistors 30, 32 to turn the transistor 16 "on". The gates of the transistors 24 and 34 are connected to the input 40.

The gates of the transistors 56 and 66 are controlled by a signal designated as 74 from the output of the transistor 14 or 16, as shown. To place the circuit in a standby condition, an enable signal designated as 76 is made available to the gates of the transistors 20, 22 and 58 while an inverted or non-enable signal designated as 78 is provided to the gates of the transistors 30, 36 and 68.

The purpose of the NAND and NOR gate configurations 26 and 38 with the pull-up and the pull-down transistor 14 and 16 is to provide a tri-state condition for these transistors so that both of them can be completely shut off and that they are in neither a high nor a low condition, which circuit is well known in the art.

The increased sensitivity of the transistor 52 as compared to that of the transistors 18 and 20, and of the transistor 62 as compared to the transistors 30 and 32 can be controlled with respect to a variety of process variables. The transistor 52 may, for example, be suitably tailored to provide a greater percentage change in a given characteristic, as compared to that of the transistors 30 and 32. For example, differences in the structure of the transistor 52 with respect to that of the transistors 30 and 32 can be made with regard to channel length, channel width, gate voltage, base mobility, threshold voltage and temperature, etc. all of which will be understood by a person skilled in the art.

In the operation of the circuit, given a signal 76 or 78, the compensation circuits 50, 60 and the driver circuits 26, 38 will be in a standby condition. Upon reception of an input signal 40, one of the NAND or NOR circuits 26, 38 and its associated compensation circuit 50 or 60 will turn "on" which will cause one of the output transistors 14 or 16 to turn "on", as appropriate to the signals 76 and 78 respectively. As previously described, the output of the compensating circuit 50 or 60, in operation, will merge with and oppose the output of its associated driver circuit. When full turn "on" of either the transistor 14 or 16 is achieved, the output is sent as a feedback signal, via node 74, to the gates of transistors 56 and 66 and turns the corresponding transistor 56 or 66 "off". The latter, in turn will consequently shut "off" both its associated voltage divider and its associated compensating transistor.

Stated otherwise, when the output of the either the transistor 14, or the transistor 16, reaches the gate threshold level of the transistors 56 or 66, their associated compensating circuit, 50 or 60 is completely turned off thereby eliminating its DC losses. For example, when the output of the transistor 14 reaches the gate threshold of the transistor 56, the latter will be turned off and will turn "off" its voltage divider and the compensating transistor 52 thereby eliminating the DC standby current of the compensating circuit 50.

As can be understood from the above described circuit, the transistors 18 and 52, or the transistors 30 and 62 provide first and second transistors respectively, having at least one performance characteristic which varies in the same manner with the variations of one process variable condition such that each has an output signal altered by a change in such performance related variable condition, and these devices are connected with such one output characteristic of the second device acts in opposition to that of the first to provide a merged output signal representative of the combined effect of both the first and second devices. Further, according to the present invention, the transistor 56 or 66 provide a third device coupled to the first and second device, and the output transistors 14 and 16 provide a fourth device to which the merged output of the first and second device is delivered so as to turn it on. In turn, the third device is shut off, and shuts off its voltage divider and compensating transistor, when the output of the fourth device rises above the threshold voltage of the third device. In that respect, the third device is shut off responsive to the merged output rising to a select value; namely that at which the fourth device is turned full on.

Advantageously, the transistors 56 and 66 turn "off" their respective voltage dividers as well as their associated compensating transistors 52 and 62 thereby reducing DC standby current. Since the transistors 56 and 66 respectively shut down both their associated voltage dividers and their associated compensating transistors, the need for an additional compensating transistor (as required by the circuit of the referenced patent) in series with each of the present compensating transistors 56 and 66, has been eliminated. The latter is of importance, since compensation requires transistors of considerable size as compared to the size of a driver transistor. Hence, in addition to the reduction in DC losses, there is a considerable saving of chip area when only one, rather than two compensating transistors is required for each driver gate.

It is also to be noted that the feedback in the circuit, of the present invention, is directly from the output of the transistors 14, 16 to the gates of transistors 56, 66 without the necessity of an inverter or delay circuit, and their attendant losses.

This completes the description of the preferred embodiment of the invention. Since changes may be made in the above process without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. An integrated circuit comprising at least a first FET device and a second FET device and a third FET device, and wherein a given performance characteristic of each of said first and second FET devices varies in the same manner with variation of at least one performance related variable condition, each of said first and second FET devices have an output signal at least one characteristic of which is changed by a change in said performance related variable condition, the output signals of said first and said second FET devices being merged, wherein said one output characteristic of said second FET device acts in opposition to said one output characteristic of said first FET device;

said second FET device being constructed to be more responsive to said variations in said performance related variable condition than said first FET device and being constructed to have a weaker output signal than said first FET device whereby the merged output signal of said first and second FET devices is maintained relatively consistent irrespective of variations in the performance related variables condition, and a voltage divider controlling said second FET device, said voltage divider including said third FET device, and said third FET device being coupled to the merged output signals of said first and said second FET devices to turn off both said voltage divider and said second FET device when said merged output signal rises to a select level.

2. The circuit of claim 1 including a fourth FET device and wherein said merged output of said first and said second FET device gates said fourth FET device into conduction, and the gate of said third FET device is connected to the output of said fourth FET device so as to turn off said voltage divider and said second FET device responsive to said output of said fourth FET device rising above the threshold voltage of said third FET device.

3. The circuit of claim 1 wherein said second FET device is a single FET device directly connected to the output of said first FET device.

4. The circuit of claim 1 wherein said first FET device is contained within a gate circuit, and said second and third FET devices are contained within a compensating circuit, said compensating circuit including a voltage divider which is connected to and controls said second FET device, and said voltage divider including said third FET device serially connected therein such that said voltage divider and said second FET device are turned off responsive to the said third FET device being turned off.

5. The circuit of claim 4 including a fourth FET device and wherein said outputs of said first and second FET devices are merged within said gate circuit and delivered to said fourth FET device so that said merged output gates said fourth FET device into conduction, and the gate of said third FET device is connected to the output of said fourth FET device so as to turn off said voltage divider and said second FET device responsive to the output of said fourth FET device rising above the threshold voltage of said third FET device.

6. An integrated circuit providing a circuit output which is compensated for variations in the process conditions employed in circuit construction, said integrated circuit comprising at least a first and second FET device and a voltage divider, said first FET device providing an output signal in response to the circuit input signal to said integrated circuit, and said second FET device providing an output signal in response to the output of said voltage divider;

each said first and second FET devices having at least one performance characteristic which varies in the same manner with variations in at least one process condition of said circuit such that said output signals of each of said first and second FET devices have at least one output signal characteristic which is changed by variations in said one process condition;

said first and second FET devices having their outputs merged such that said one output signal characteristic of said second FET device acts in opposition to that of said first FET device, and said second FET device being constructed to be more responsive to variations in said one process condition than said first FET device and to have a weaker output signal than said first FET device whereby said merged output of said first and second FET devices is maintained relatively consistent irrespective of variations in said one process condition; and said voltage divider including a third FET device having its gate coupled to said circuit output so that said third FET is rendered nonconductive to thereby turn off said voltage divider when said circuit output is above the threshold voltage of said third FET device.

7. The circuit of claim 6 including a fourth FET device, said merged outputs of said first and second FET devices gate said fourth FET device into conduction to produce said circuit output, and the gate of said third FET device is directly connected to the output of said fourth FET device without any circuit delay branch intervening therebetween to thereby turn off said voltage divider and said second FET device responsive to the output of said fourth FET device rising above the threshold voltage of said third FET device.

8. An integrated circuit providing a circuit output which is compensated for variations in the process conditions employed in circuit construction, said integrated circuit comprising at least a first and second FET device and a voltage divider, said first FET device providing an output signal in response to the circuit input signal to said integrated circuit, and said second FET device providing an output signal in response to the output of said voltage divider;

each said first and second FET devices having at least one performance characteristic which varies in the same manner with variations in at least one process condition of said circuit such that said output signals of each of said first and second FET devices have at least one output signal characteristic which is changed by variations in said one process condition;

said first and second FET devices having their outputs merged such that said one output signal characteristic of said second FET device acts in opposition to that of said first FET device, and said second FET device being constructed to be more responsive to variations in said one process condition than said first FET device and to have a weaker output signal than said first FET device whereby said merged output of said first and second FET devices is maintained relatively consistent irrespective of variations in said one process condition; and said voltage divider including a third FET device having its gate coupled to said circuit output so that said third FET is rendered nonconductive to thereby turn off said voltage divider when said circuit output is above the threshold voltage of said third FET device, said first FET device is provided within a circuit branch which is placed in standby condition in response to an enable signal, said voltage divider includes an additional FET device connected in series with said third FET device, and said additional FET device is rendered conductive in response to said enable signal to place said voltage divider in standby condition.

9. An integrated circuit providing a circuit output which is compensated for variations in the process conditions employed in circuit-construction, said integrated circuit comprising at least a first and second FET device and a voltage divider, said first FET device providing an output signal in response to the circuit input signal to said integrated circuit, and said second FET device providing an output signal in response to the output of said voltage divider;

each said first and second FET devices having at least one performance characteristic which varies in the same manner with variations in at least one process condition of said circuit such that said output signals of each of said first and second FET devices have at least one output signal characteristic which is changed by variations in said one process condition;

said first and second FET devices having their outputs merged such that said one output signal characteristic of said second FET device acts in opposition to that of said first FET device, and said second FET device being constructed to be more responsive to variations in said one process condition than said first FET device and to have a weaker output signal than said first FET device whereby said merged output of said first and second FET devices is maintained relatively consistent irrespective of variations in said one process condition; and said voltage divider including a third FET device having its gate coupled to said circuit output so that said third FET is rendered nonconductive to thereby turn off said voltage divider when said circuit output is above the threshold voltage of said third FET device, said voltage divider includes another FET device connected in series with said third FET device, and said another FET device is rendered conductive in response to said circuit input signal.

10. The circuit of claim 9 wherein said first FET device is contained within a circuit branch which is placed in standby condition in response to an enable signal, said voltage divider includes an additional FET device connected in series with said third FET device and said another FET device, and said additional FET device is rendered conductive in response to said enable signal whereby said voltage divider is only rendered operative in response to both said circuit input signal and said enable signal and rendered inoperative when said circuit output is above the threshold voltage of said third FET device.

11. The circuit of claim 10 wherein said output of said second FET device is connected directly to the output of said first FET device.

\* \* \* \* \*